United States Patent
Sun et al.

(10) Patent No.: US 10,691,537 B2
(45) Date of Patent: Jun. 23, 2020

(54) STORING DEEP NEURAL NETWORK WEIGHTS IN NON-VOLATILE STORAGE SYSTEMS USING VERTICAL ERROR CORRECTION CODES

(71) Applicant: Western Digital Technologies, Inc., San Jose, CA (US)

(72) Inventors: Chao Sun, San Jose, CA (US); Minghai Qin, San Jose, CA (US); Dejan Vucinic, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 63 days.

(21) Appl. No.: 16/158,650

(22) Filed: Oct. 12, 2018

(65) Prior Publication Data

US 2020/0117539 A1    Apr. 16, 2020

(51) Int. Cl.
| | | |
|---|---|---|
| G06F 11/10 | (2006.01) | |
| H03M 13/11 | (2006.01) | |
| G06N 3/063 | (2006.01) | |
| H04L 1/00 | (2006.01) | |
| G11C 29/52 | (2006.01) | |

(52) U.S. Cl.
CPC ...... G06F 11/1068 (2013.01); G06F 11/1048 (2013.01); G06N 3/0635 (2013.01); G11C 29/52 (2013.01); H03M 13/1105 (2013.01); H04L 1/0057 (2013.01); H04L 1/0061 (2013.01)

(58) Field of Classification Search
CPC ........... G06F 11/1068; G06F 11/1048; H03M 13/1105; H04L 1/0061; H04L 1/0057; G11C 29/52; G06N 3/0635
See application file for complete search history.

(56) References Cited

U.S. PATENT DOCUMENTS

| | | | | |
|---|---|---|---|---|
| 5,218,622 A | * | 6/1993 | Fazel ..................... | H04N 19/50 375/240 |
| 2008/0082897 A1 | * | 4/2008 | Brandman .......... | G06F 11/1068 714/763 |
| 2009/0241006 A1 | * | 9/2009 | Liikanen ............. | G06F 11/1072 714/752 |
| 2009/0276687 A1 | * | 11/2009 | Kim .................... | G06F 11/1072 714/777 |
| 2012/0144270 A1 | * | 6/2012 | Diggs ................. | G06F 11/1068 714/769 |
| 2017/0109231 A1 | * | 4/2017 | Cha ..................... | G06F 11/1068 |
| 2017/0116075 A1 | | 4/2017 | Yang et al. | |

* cited by examiner

*Primary Examiner* — Thien Nguyen

(74) *Attorney, Agent, or Firm* — Vierra Magen Marcus LLP

(57) ABSTRACT

Techniques are presented for efficiently storing deep neural network (DNN) weights or similar type data sets in non-volatile memory. For data sets, such as DNN weights, where the elements are multi-bit values, bits of the same level of significance from the elements of the data set are formed into data streams. For example, the most significant bit from each of the data elements are formed into one data stream, the next most significant bit into a second data stream, and so on. The different bit streams are then encoded with differing strengths of error correction code (ECC), with streams corresponding to more significant bits encoded with stronger ECC code than streams corresponding to less significant bits, giving the more significant bits of the data set elements a higher level of protection.

19 Claims, 14 Drawing Sheets

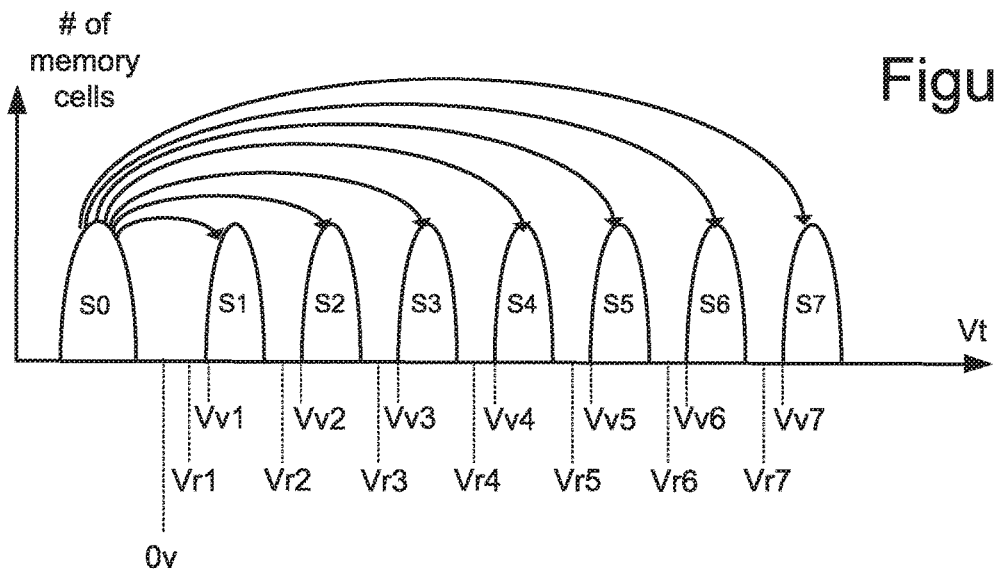
Figure 6
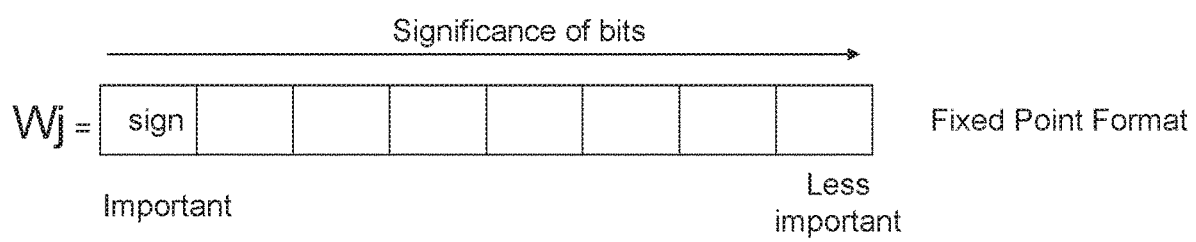
Figure 11A
$$CW_i = (W0, W1, \ldots, Wm; P)$$
Figure 11B
$$Page_k = (CW_1, CW_2, \ldots, CW_n)$$
Figure 11C $$CW'(S0)_i = (S0_0, S0_1, \ldots, S0_m; P; tag)$$

$$Page'_k = (CW'_1, CW'_2, \ldots, CW'_n)$$

STORING DEEP NEURAL NETWORK WEIGHTS IN NON-VOLATILE STORAGE SYSTEMS USING VERTICAL ERROR CORRECTION CODES

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory, volatile memory or both. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

When a memory system is deployed in or connected to an electronic device (e.g., host), the memory system can be used to store (i.e., write) data and read data. To help ensure the quality of the data, memory systems commonly employ Error Correction Code ("ECC"), where the user data is supplemented with additional ECC data that can be used to correct errors that may arise during the reading, writing, storage, or transfer of the user data. The greater the amount of ECC data used for a set of user data, the greater the amount of error that can be corrected. However, using greater amounts of ECC can diminish performance, as the encoding and decoding of the user data during writing and reading becomes more complex and time consuming, and takes up memory space that otherwise could be used for user data.

BRIEF DESCRIPTION OF THE DRAWINGS

Like-numbered elements refer to common components in the different figures.

FIG. 6 depicts threshold voltage distributions for multi-state memory cells.

FIG. 11A illustrates a DNN weight presented in a fixed point format.

FIG. 11B illustrates forming an Error Correction Code (ECC) codeword from multiple DNN weights.

FIG. 11C illustrates forming a page from multiple ECC codewords.

DETAILED DESCRIPTION

Figure 1:
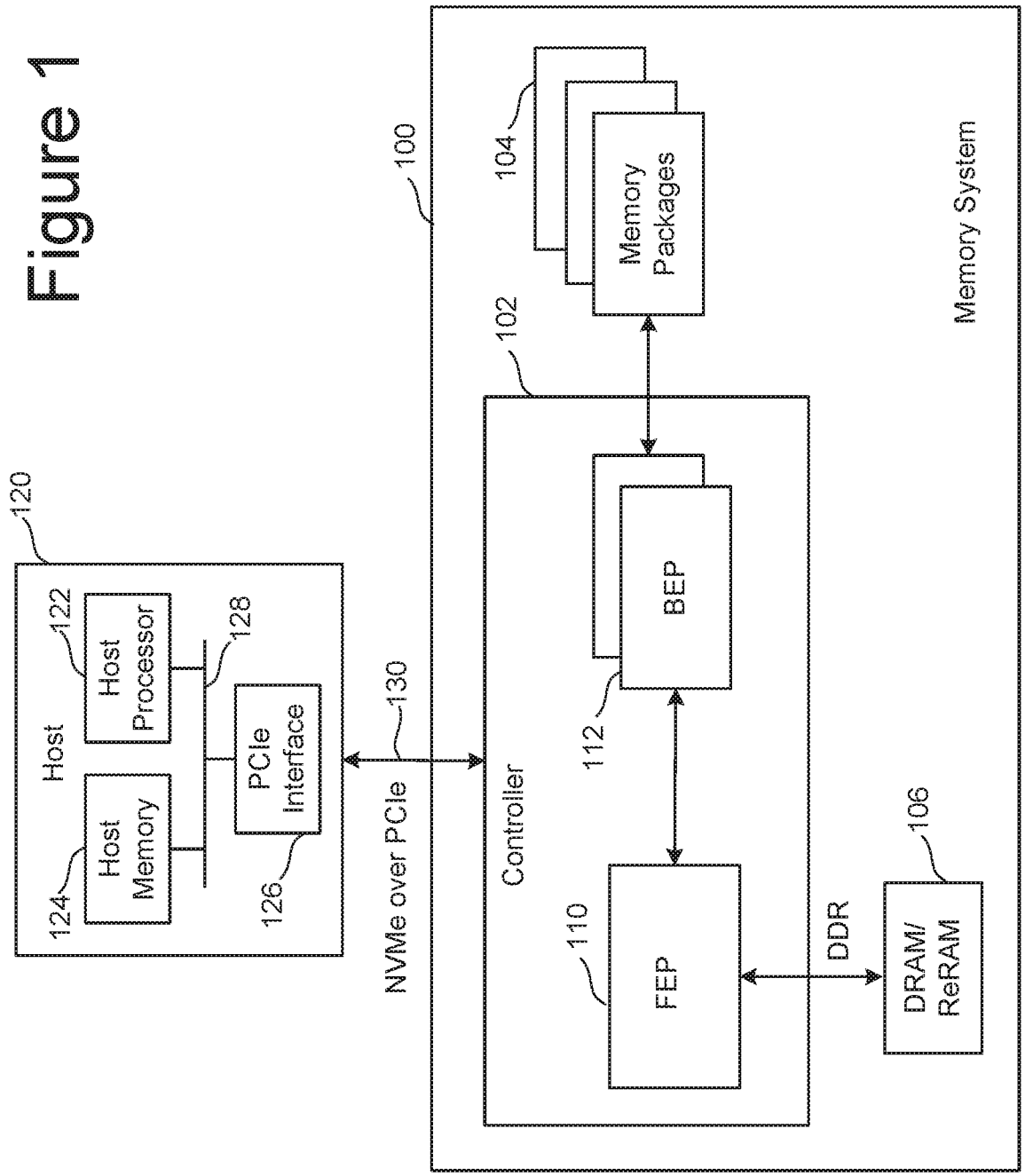
FIG. 1 is a block diagram of one embodiment of a memory system connected to a host.

In some applications where non-volatile memory is used for storing data sets, the application can tolerate some amount of error in the values of its data set. To take a specific example, the weights used in Deep Neural Networks (DNN) employed for deep learning can generally still provide accurate results even when the weights have some inaccuracy. For such data sets, when the individual data elements of the set are multiple-bit values, the more significant bits of the data elements should have minimal error, but the system can tolerate more error for the bits of lesser significance. Consequently, when storing such data, the more significant bits should be stored with high accuracy, while bits of lesser significances need not be stored with as high a degree of accuracy.

To accurately store data, memory devices often employ ECC. In using error correction codes, a memory system breaks up a data set into codewords, where each codeword includes a portion of the data set along with some corresponding ECC generated from the portion of the data set. The codewords, both the data portion and its corresponding ECC, are stored in the memory and when read back out, the ECC portion of a codeword can be used to detect and correct error that entered into the codeword in the course of writing, storing, and reading back out of the codeword. The amount of error that can be determined and corrected in a codeword depends on the strength of the ECC used, where, along with the ECC algorithm used, the strength the ECC depends on the number of bits of a codeword given over to ECC data. Encoding codewords with stronger ECC provides for greater data integrity, but at the cost of lower performance, as more computation is needed for encoding and decoding, and reduced memory space for user data, as more memory area that could otherwise store user data is given over to ECC data. Consequently, the level of ECC used is a trade-off between data integrity and performance and available memory capacity.

In applications that can tolerate some amount of error in the values of a data set, such as the DNN weight example mentioned above, this property can be used to optimize the application of ECC to the data values. More specifically, more significant bits of the data values can be encoded with a stronger ECC and less significant bits can be encoded with a weaker ECC. In this way, the more significant bits are maintained with sufficient accuracy to be able to provide the data set values with sufficient accuracy in the more significant bits while saving space on the ECC used for bits of lesser significance.

To this end, a "vertical" ECC is used to encode data values for a data set, where, rather than form an ECC codeword "horizontally" from a string of multi-bit data values, the ECC codewords are formed from bits of the same significance from different data values. For a set of multi-bit data values, the most significant bit of the data values is formed into one stream, the next most significant bit of the data values is formed in a second data stream, and so on until the least significant bit of the data values is formed into a data stream. The streams corresponding to higher order bits can then be encoded and stored with stronger ECC while streams corresponding to lower order bits can be encoded and stored with weaker ECC. Depending on the embodiments, the different levels of ECC can be implemented by different ECC encoders/decoders of different strengths, by variable strength ECC encoders/decoders, or by a combination of these.

FIG. 1 is a block diagram of one embodiment of a memory system 100 connected to a host 120. Memory system 100 can implement the technology proposed herein, where DNN weights or other data are received as streams from the host 120, the different streams corresponding to bits of different significance and specifying a corresponding level of ECC to be used. On the memory system 100, the controller 102 encodes the data streams with the corresponding level of ECC, forms the streams into ECC codewords, forms the codewords into pages, and transfers the pages to the memory packages 104 to be written into memory. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a Controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
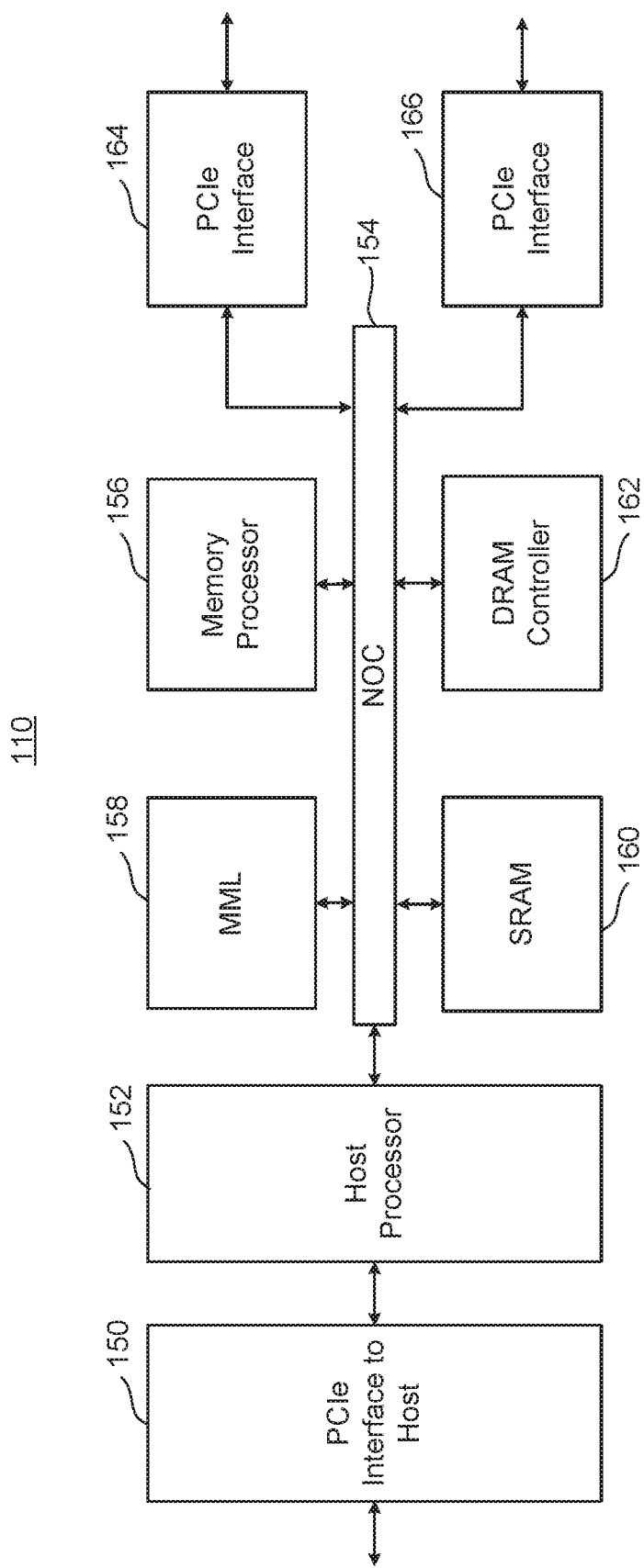
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
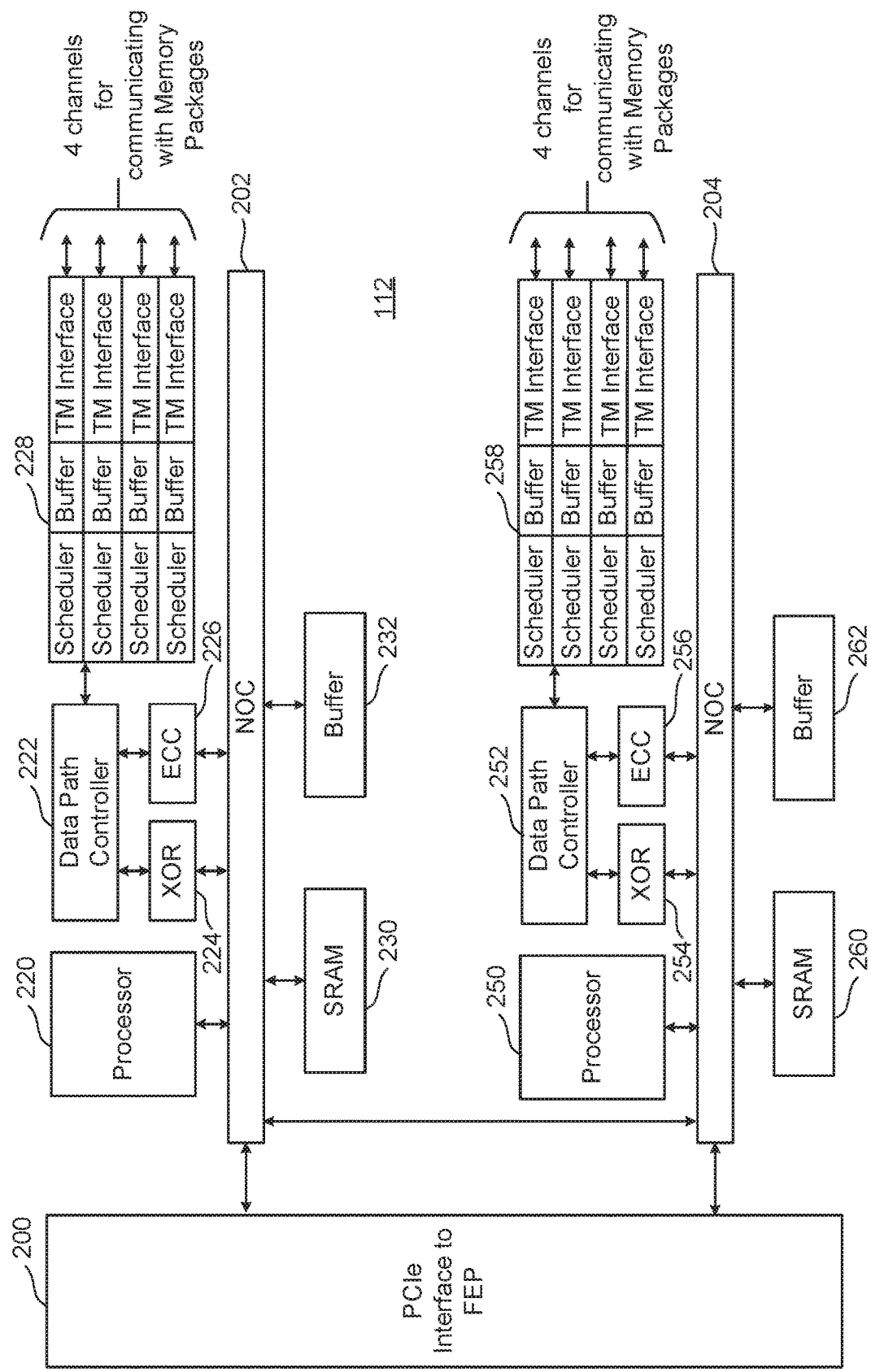
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. Embodiments of the ECC engines 224/254 are discussed further below, with respect to the use of "vertical ECC". The scheduler, buffer, and TM Interfaces are hardware circuits.

Figure 4:
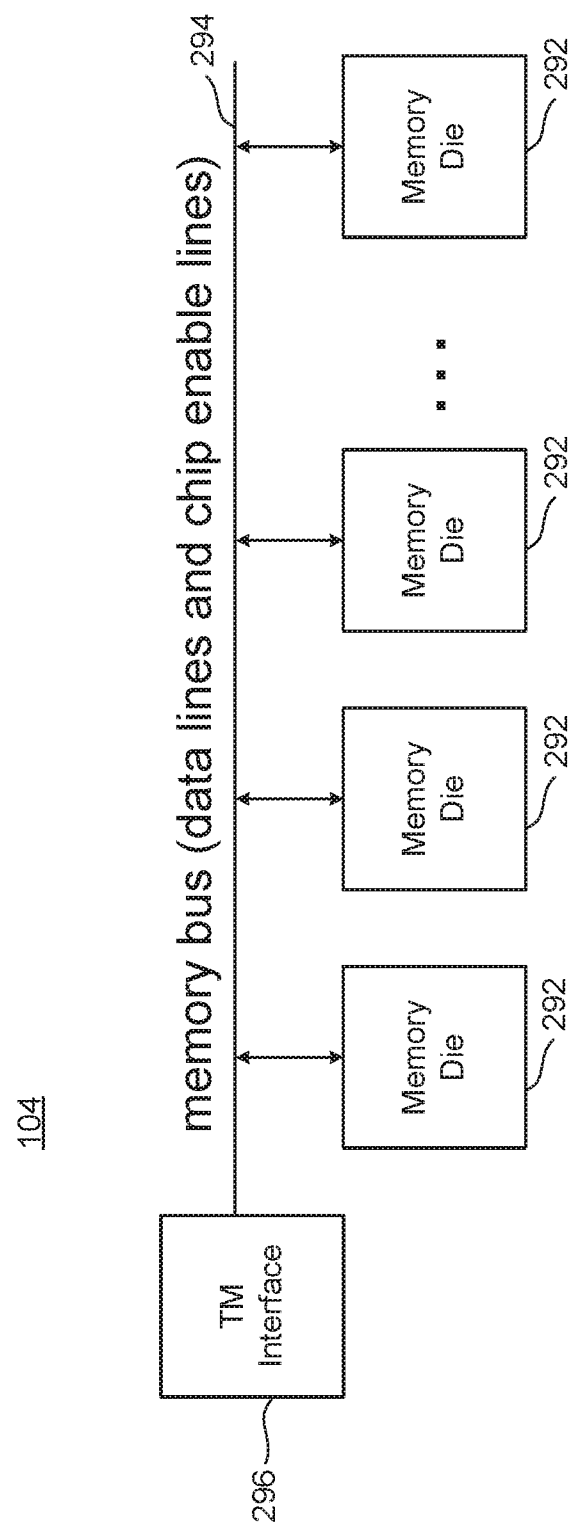
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5:
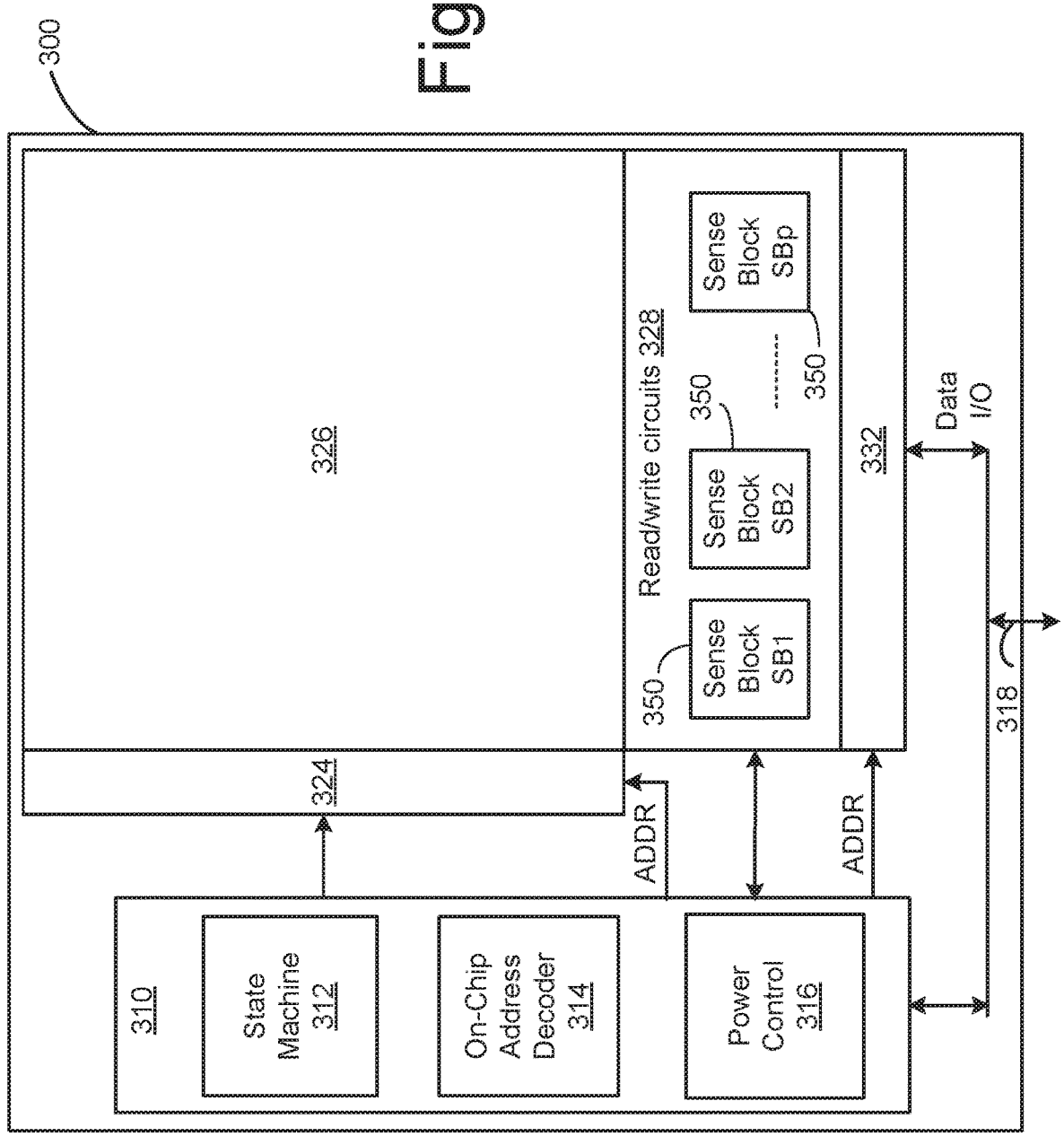
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 126 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the Controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, and a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM fuses and other storage devices for storing default values such as base voltages and other parameters.

The on-chip address decoder 314 provides an address interface between addresses used by Controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" refers to a controller, a state machine, a micro-controller and/or control circuitry 310, or other analogous circuits that are used to control non-volatile memory.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like.

Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

The memory systems discussed above can be erased, programmed/written and read. At the end of a successful programming process, the threshold voltages of the memory cells should be within one or more distributions of threshold voltages for programmed memory cells or within a distribution of threshold voltages for erased memory cells, as appropriate. FIG. 6 illustrates example threshold voltage distributions for the memory cell array when each memory cell stores more than one bit of data in a multi-level cell (MLC) format, in this case three bits of data. Other embodiments, however, may use other data capacities per memory cell (e.g., such as one, two, four, or five bits of data per memory cell). FIG. 6 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 6 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-S7 can overlap, with controller 102 relying on ECC to identify the correct data being stored.

Figure 7:
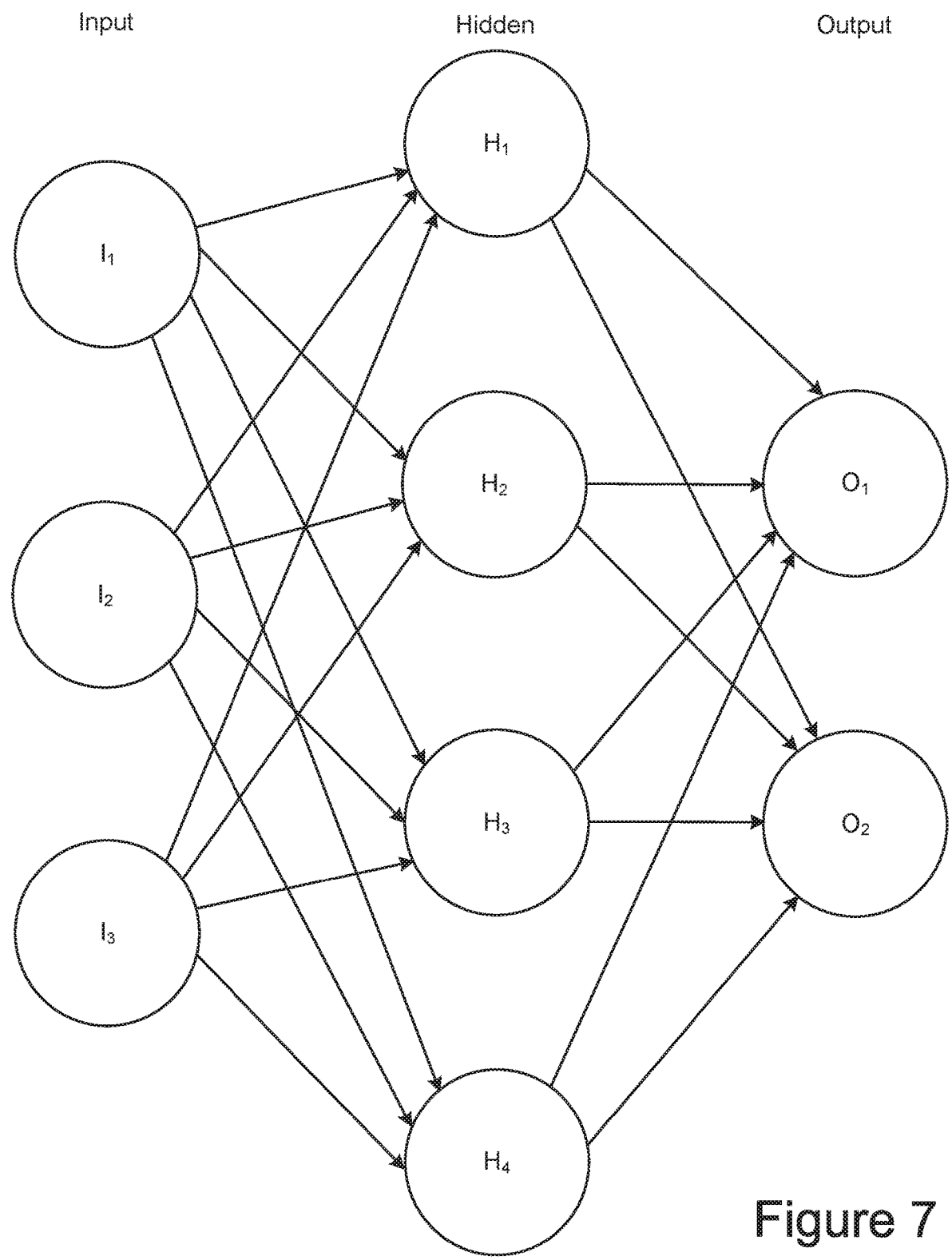
FIG. 7 illustrates a simple example of an artificial neural network.

Turning now to types of data that can be stored on non-volatile memory devices, a particular example of the type of data of interest in the following discussion is the weights used is in deep neural networks. A Deep Neural Network (DNN) is an artificial neural network with multiple layers between the input and output layers. The DNN finds a mathematical manipulation to turn the input into the output, moving through the layers calculating the probability of each output. FIG. 7 illustrates a simple example of an artificial neural network.

In FIG. 7 an artificial neural network is represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons, of the artificial neural network are implemented by logic elements of a host or other processing system as a mathematical function that receives one or more inputs and sums them to produce an output. Usually each input is separately weighted and the sum is passed through the node's mathematical function to provide the node's output.

In common artificial neural network implementations, the signal at a connection between nodes (artificial neurons) is a real number, and the output of each artificial neuron is computed by some non-linear function of the sum of its inputs. Nodes and their connections typically have a weight that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer), to the last layer (the output layer), possibly after traversing the layers multiple times. Although FIG. 7 shows only a single intermediate or hidden layer, a complex deep neural network (DNN) can have many such intermediate layers (hence the "deep").

A DNN or other artificial neural network is "trained" by supplying inputs and then checking and correcting the outputs. For example, a DNN that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex DNNs have many layers. Due to the depth provided by a large number of intermediate or hidden layers, DNNs can model complex non-linear relationships as they are trained.

Figure 8B:
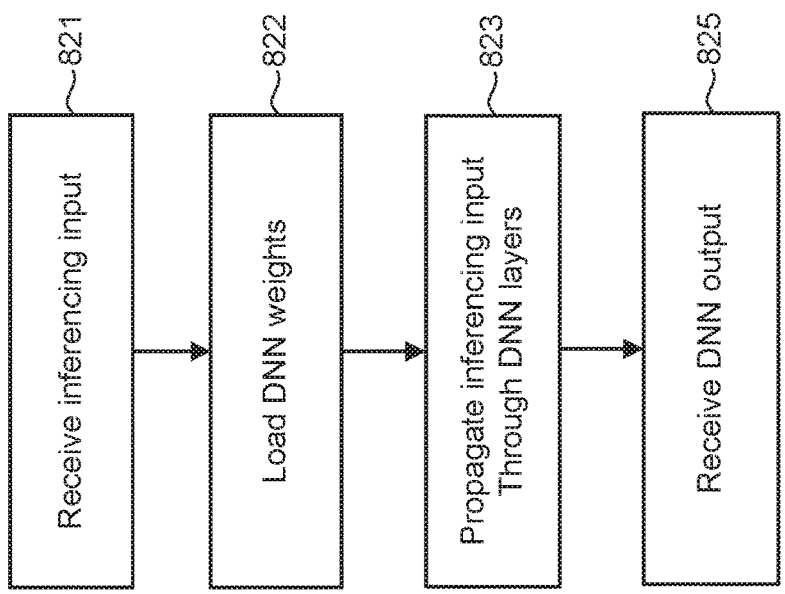
FIG. 8B is a flowchart describing one embodiment of a process for inference using a DNN.
Figure 8A:
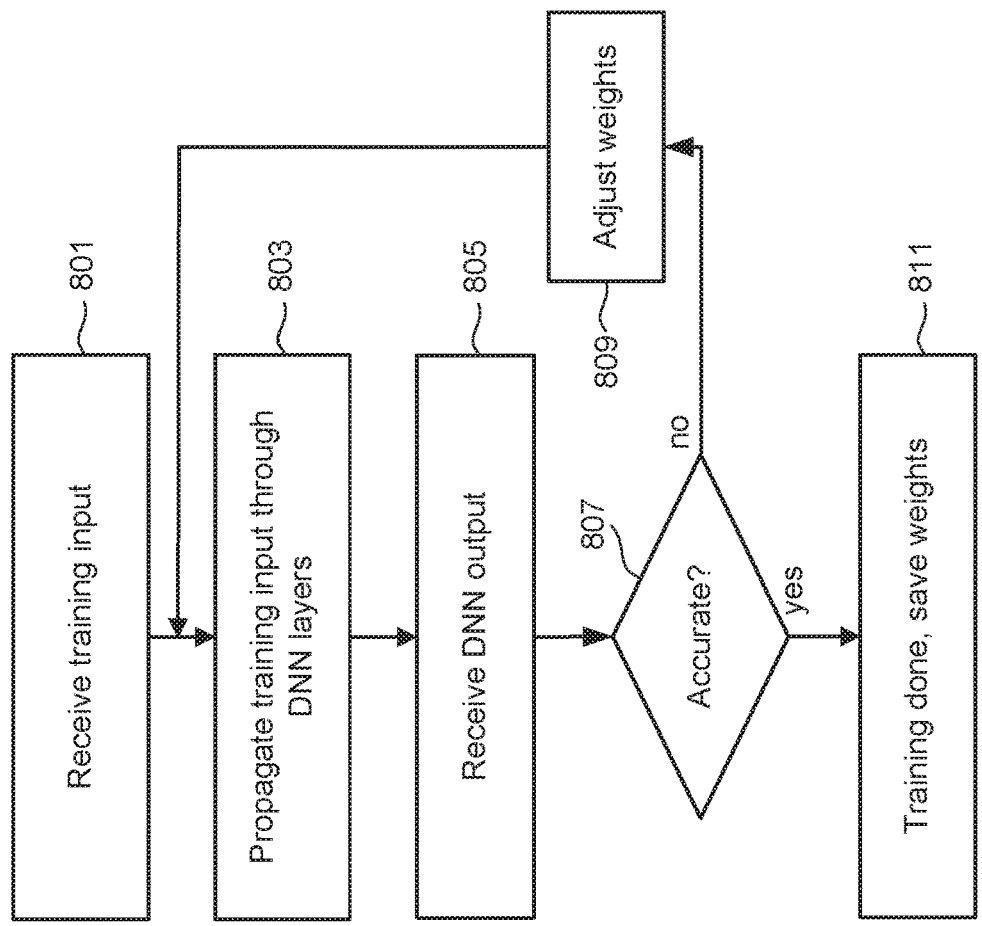
FIG. 8A is a flowchart describing one embodiment of a process for training a DNN to generate a set of weights.

FIG. 8A is a flowchart describing one embodiment of a process for training a DNN to generate a set of weights. The training process is often performed in the cloud, allowing additional or more powerful processing the accessed. At step 801, the input, such as a set of images, is received at the input nodes (e.g., $I_1$, $I_2$, $I_3$ in FIG. 7). At step 803 the input is propagated through the nodes of the hidden intermediate layers (e.g., $H_1$, $H_2$, $H_3$, $H_4$ in FIG. 7) using the current set of weights. The DNN's output is then received at the output nodes (e.g., $O_1$, $O_2$ in FIG. 7) in step 805. In the dog breed example of the preceding paragraph, the input would be the image data of a number of dogs, and the intermediate layers use the current weight values to calculate the probability that the dog in an image is a certain breed, with the proposed dog breed label returned at step 805. A user can then review the results at step 807 to select which probabilities the DNN should return and decide whether the current set of weights supply a sufficiently accurate labelling and, if so, the training is complete (step 811). If the result is not sufficiently accurate, the DNN adjusts the weights at step 809 based on the probabilities the user selected, followed by looping back to step 803 to run the input data again with the adjusted weights. Once the DNN's set of weights have been determine, the can be used to "inference," which is the process of using the determined weights to generate an output result from data input into the DNN. Once the weights are determined at step 811, they can then be stored in non-volatile memory for later use, where the storage of these weights in non-volatile memory is discussed in further detail below.

FIG. 8B is a flowchart describing one embodiment of a process for inference using a DNN. Depending on the case, the DNN may be inferenced both at cloud and by an edge device's (e.g., smart phone, automobile process, hardware accelerator) processor. At step 821, the input is received, such as the image of a dog in the example used above. If the previously determined weights are not present in the device running the DNN application, they are loading at step 822. For example, on a host processor executing the DNN, the weight could be read out of an SSD in which they are stored and loaded into RAM on the host device. At step 823, the input data is then propagated through the DNN's layers. Step 823 will be similar to step 803 of FIG. 8B, but now using the weights established at the end of the training process at step 811. After propagating the input through the intermediate layer, the output is then provided at step 825.

DNNs are typically feedforward networks in which data flows from the input layer, through the intermediate layers, and to the output layer without looping back. At first, the DNN creates a map of virtual neurons and assigns random numerical values, or "weights", to connections between them. The weights and inputs are multiplied and return an output between 0 and 1. If the network does not accurately recognize a particular pattern, an algorithm adjusts the weights. That way the algorithm can make certain parameters more influential (by increasing the corresponding weight) or less influential (by decreasing the weight) and adjust the weights accordingly until it determines a set of weights that provide a sufficiently correct mathematical manipulation to fully process the data.

Deep learning is becoming more and more important in many applications for artificial intelligence purposes, such as computer vision, speech recognition, natural language processing (NLP), self-driving, and other applications. DNN weights are typically only updated during training (the process of establishing values for the weights) and read only for inference. Further, DNN weights are generally "zero-centered", in that distribution of weight values is centered about a value at or near zero and largely symmetric, where negative weight values corresponding to a negative correlation. The weight distribution is also typically rather shapely peaked around the zero center, as most of the weight values will be of small amplitude. DNNs are typically quite robust with respect to weight errors. The following presents methods to store DNN weights in non-volatile memory, such as a solid-state drive (SSD), that can provide high reliability while still maintaining memory performance.

DNN weights are an example of a type of data where the large majority of data values are small, near zero, with only a relatively few deviating far from zero; and the process using the data set is quite robust in that it can tolerate a moderate amount of error and still return accurate results. For such a data set, although the values need to be accurate, the application using them can accept some degree of inaccuracy: Consequently, more significant bits of data values need to be accurate, lesser significant bits less so. Although the following is discussed primarily in the context of storing DNN weights, the same techniques can similarly be applied to other data sets the similarly have these properties.

Conventionally, DNN weights and similar type data sets are stored as floating point data in a host machines and fixed point data in edge devices (e.g., smart phone, automobile process, hardware accelerator, SSD, or other devices connected to the hosting device). In edge devices, pruning and other software techniques are used to further reduce the size of weights to reduce the memory footprint of the DNN weights without sacrificing the accuracy of models. More aggressively, fewer digit fixed point (less accuracy) is used to shrink the weights size by using a smaller number of bits used in storing them.

In the techniques described in the following, when storing DNN weights or other data sets in SSDs or other edge devices, errors in sign bit and more significant bits (near the most significant bit, MSB) affect accuracy of DNN models more than the errors in lesser significance bits (near the least significant bit, LSB). For storing the weights in a non-volatile memory device such as an SSD, as described in the following a "vertical" ECC (where codewords are formed from bits of the same level of significance from different data set elements) is used for the weights' storage with reliability protection, where ECC strength can be dynamically adjusted for each bit in the weight. When weights are stored to the SSD, the bits in each weight are clustered into bit streams with software assistance in the host device. During writing to the SSD, each bit stream can be encoded with a different code rate (ECC strength) according to its importance, where this could be predetermined by a general rule or application of empirical study. During reading, each bit stream is decoded with the corresponding code rate. When the weights are used during inference, they are loaded from non-volatile memory into host RAM. As a result, the ECC overhead can be optimized to provide more ECC protection (using more space in the memory) for the more significant bits, while using less storage space for the ECC of the less significant bits.

After training, the DNN weights are stored in storage devices. During training, the weights are updated iteratively. During inferencing, the weights are load into RAM and used for matrix multiplication and other operations in a fast forwarding path. In the following embodiments, the storage can be customized to store the weights, considering the space, speed and reliability in how the weights are stored. This can be done by considering features of the DNN weight data sets.

Figure 9:
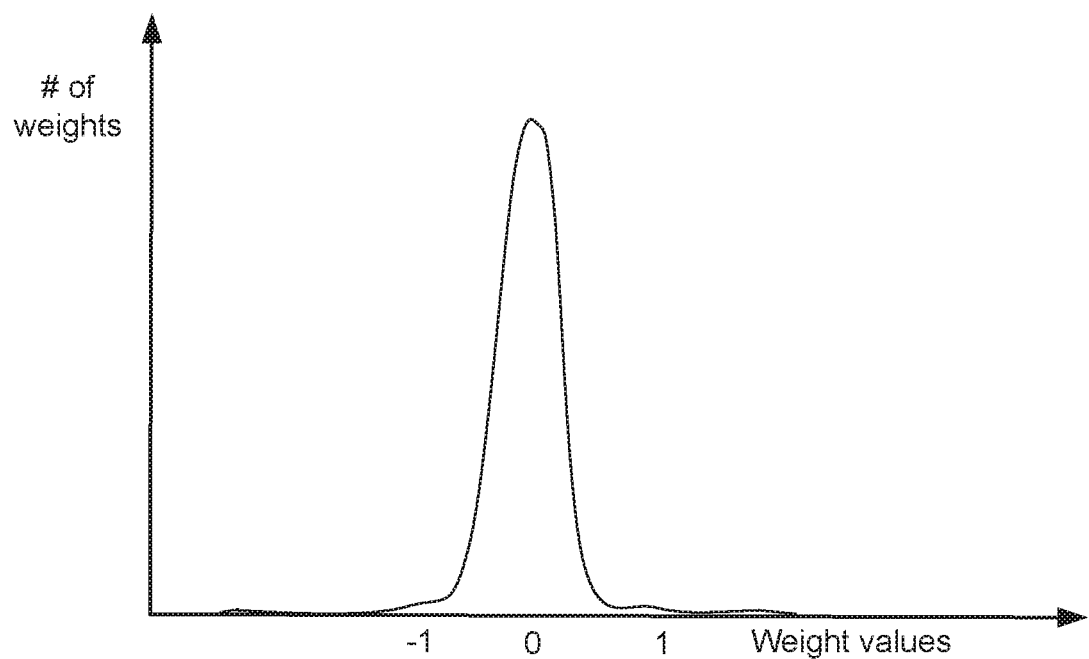
FIG. 9 illustrates a typical distribution for a set of Deep Neural Network (DNN) weights.

A first of these features is that, as described above, DNN weights are "zero centered." This property is illustrated in FIG. 9. FIG. 9 illustrates a typical distribution for a set of DNN weights. In FIG. 9, the horizontal axis corresponds to weight values and the vertical axis corresponds to the numbers of weights. The distribution is centered on 0, with the large majority of well within the −1 and +1 values. The means that for most of the weights, a fairly accurate value can be captured by the first few significant bits of a multi-bit value.

Figure 10:
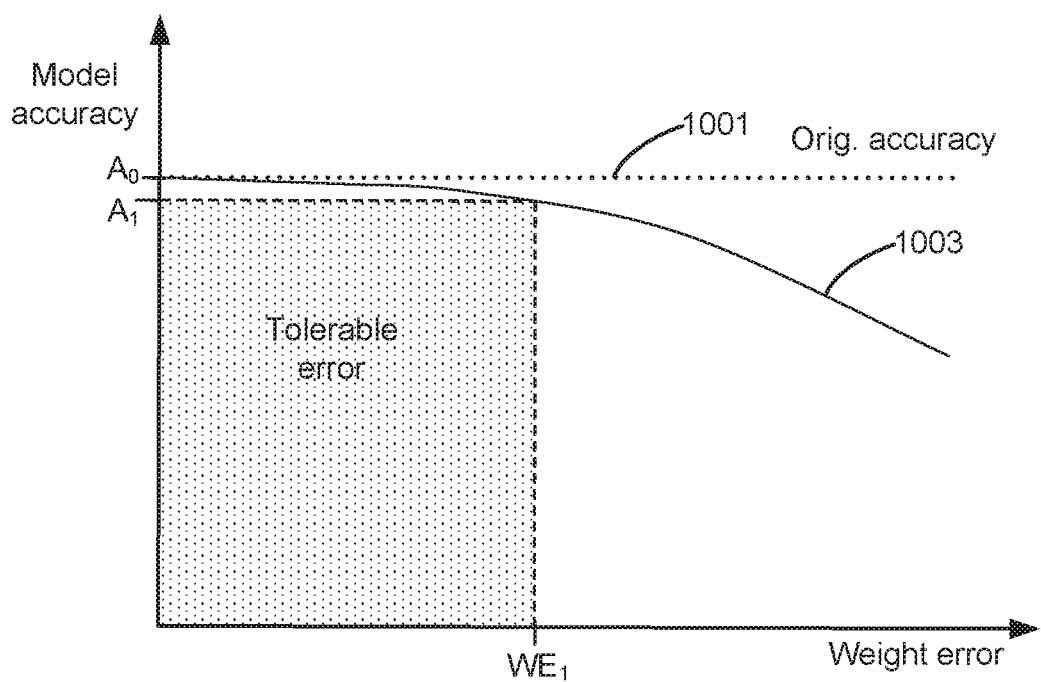
FIG. 10 looks at DNN model accuracy as a function of weight error.

Another feature is that DNNs are designed to be quite robust with respect to error (noise). When the error leads to a small change to the absolute value of the weight, the output accuracy of DNN does not degrade much. This is illustrated with respect to FIG. 10, which looks at model accuracy as a function of weight error. As shown in FIG. 10, when there is no weight error, the model has an original level accuracy of $A_0$ as shown by the line 1001. As amount of weight error increase, the model's accuracy falls off, as illustrated at 1003, initially being fairly flat, but eventually falling off more rapidly. If the DNN application can tolerate somewhat less accuracy, such as the level $A_1$, then a non-zero amount of weight error can be allowed while still providing acceptable accurate results. In the example of FIG. 10, the acceptable level of model accuracy $A_1$ corresponds to a tolerable amount of weight error $WE_1$. Although the acceptable amount of model accuracy $A_1$ and the corresponding amount of tolerable error $WE_1$ are application dependent, FIG. 10 illustrates the general feature that DNNs are quite robust when it comes to weight error.

To save weight space and reduce inference computation requirements that values with higher numbers of bits require, fixed point format can be used instead of floating point, where, for example, instead of 32 bits for one weight, this could be reduced to 16 bits, 8 bits and even less than 8 bits. The features illustrated with respect to FIGS. 9 and 10 can also be used to reduce the amount of space devoted to ECC when storing such weights.

Because it is possible that errors can occur when programming or reading, and errors can occur while storing data (e.g., due to electrons drifting, data retention issues or other phenomenon), error correction is used with the programming of a page of data. Memory systems often use ECC to protect data form corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual codeword is unchanged from the actual data being encoded, with the code or parity bits appended to the data bits to form the complete codeword.

The particular parameters for a given error correction code include the type of code, the size of the block of actual data from which the codeword is derived, and the overall length of the codeword after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the Controller 102 receives host data, also referred to as information bits, that is to be stored non-volatile three dimensional memory structure 326. The informational bits are represented by the matrix i=[1 0] (note that two bits are used for example purposes only, and many embodiments have codewords longer than two bits). An error correction coding process (such as any of the processes mentioned above or below) is implemented in which parity bits are added to the informational bits to provide data represented by the matrix or codeword v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, Jan. 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in the non-volatile storage 126 by programming one or more memory cells to one or more programming states, which corresponds to the matrix or codeword v.

In one possible implementation, an iterative probabilistic decoding process is used when reading data which implements error correction decoding corresponding to the encoding implemented in the Controller 102 (see ECC engines 226/256). Further details regarding iterative probabilistic decoding can be found in the above-mentioned D. MacKay text. The iterative probabilistic decoding attempts to decode a codeword read from the memory by assigning initial probability metrics to each bit in the codeword. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by:

$$Q = \log_2 \frac{P(v=0\mid Y)}{P(v=1\mid Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a codeword. Further, the LLR tables can account for the multiple read results so that an LLR of greater magnitude is used when the bit value is consistent in the different codewords.

Controller 102 receives the codeword CW1 and accesses the LLRs and iterates in successive iterations in which it determines if parity checks of the error encoding process have been satisfied. If all parity checks have been satisfied, the decoding process has converged and the codeword has been successfully error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the codeword, if applicable, once the parity check in question has been satisfied. In others, the process moves to the next parity check, looping back to the failed check at a later time. The process continues in an attempt to satisfy all parity checks. Thus, the decoding process of CW1 is completed to obtain the decoded information including parity bits v and the decoded information bits i.

Returning now the example of DNN weights, FIGS. 11A, 11B, and 11C look at a conventional storage method for DNN weights or elements of other data sets of a similar format. FIG. 11A illustrates a weight Wj stored in a fixed point format of, for example, 8 bits. The more important (i.e., more significant) bits are to the left, beginning with a sign bit, followed by the most significant non-sign bit, and then bits decreasing importance (lesser significant moving) to the right. When storing the weights into non-volatile memory protected by ECC, the DNN weight would conventionally be formed into codewords as shown in FIG. 11B, where a codeword $CW_i$ is formed of all of the bits of multiple weights W0, W1, . . . , Wm and the corresponding ECC, or parity, data P that protects the data portion of the codeword. As discussed in more detail above, codeword can be formed in many ways, depending upon the algorithm used and the strength of the ECC, so that FIG. 10B should be consider a schematic representation. In prior implementations, the codewords are formed based on complete weights, including all of the bits in each of the weights. Multiple codewords are then formed into pages, as shown in FIG. 11C where a page $Page_k$ is formed of codewords $CW_1$, $CW_2$, . . . , $CW_n$). The pages of data are then transferred to a memory circuit and written into the non-volatile memory.

Under the arrangement illustrated with respect to FIGS. 11A, 11B, and 11C, all of the bits of the DNN weights are protected by the same level of ECC, whether for the most significant bits or the least significant bits. Under this arrangement, to ensure that the most significant bits are sufficiently protected also results in the least significant bits being protected to this same level. However, as discussed with respect to FIGS. 9 and 10, DNNs can tolerate a fair degree of error in the weight values while still providing acceptable accuracy. Consequently, for DSS weights, or other data sets with similar properties, storing bits of less significance with the highest strength of ECC results in lower performance, as more intensive decoding must be used, and loss of storage space, as more of the memory that could otherwise go to user data must be devoted to ECC data. To improve upon this situation, the embodiments for storing DNN weights and similar data sets described here used differing levels of ECC for bits of differing significance. More specifically, a vertical ECC approach is used for storing DNN weights is introduced, as illustrated schematically with respect to FIG. 12, which illustrates the "vertical" concept involved.

Figures 12, 13A, 13B:
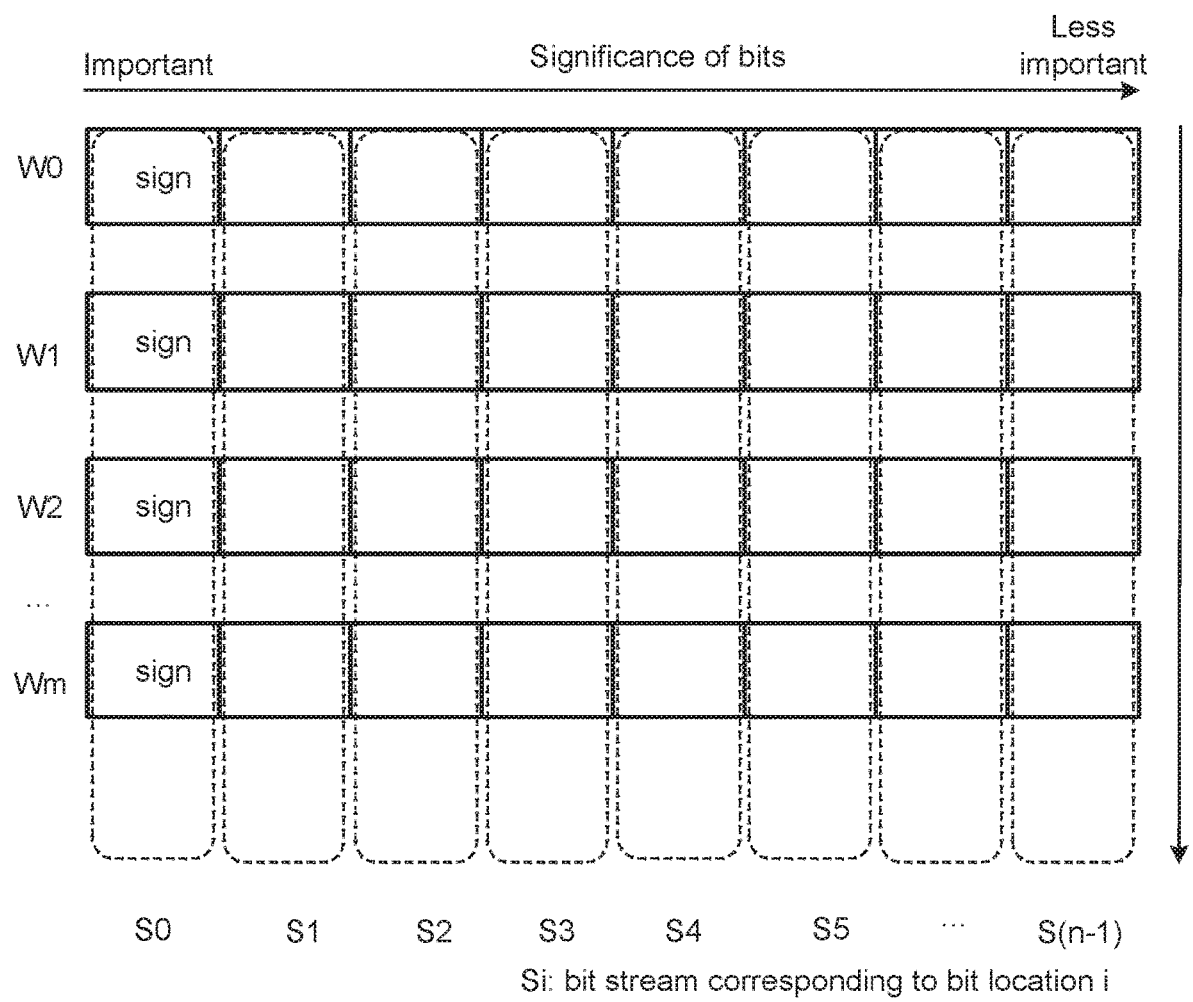
FIG. 12 shows the arranging of a number of DNN weights into multiple data streams for bits of differing significance.
FIGS. 13A and 13B illustrate the forming of the data streams into codewords and the forming of these codewords into pages.

FIG. 12 shows a number of DNN weights: W0, W1, W2, . . . , Wm. These are in a fixed point format of (in this example) n bits, where the different weights are shown arranged vertically, with the most significant bit (the sign) of each weight in the first column (left), the next most significant bit in the next column, and so on down to the least significant bit (right). Rather than arrange the weights into codewords as shown in FIGS. 11A, 11B, and 11C, each column is organized into a bit stream of data (S0, S1, ..., S(n−1)) which can be encoded with differing strengths of ECC.

Still referring to FIG. 12, each weight is partitioned into n bits, plus a sign bit. Bits in the same column position (i.e., same significance) are grouped together into the same stream (most significant bits to S0, next most significant bit to S1, and so on to S(n−1)). Each of the streams can encoded into ECC codewords with an ECC encoder/decoder, where different streams can have different code rates, or protection strength. The original data format can be reorganized by the host, through software, hardware, firmware, or some combination of these on a host driver, with the re-formatted data then sent on to the SSD for storage. As illustrated in the embodiment of FIG. 12, each column of bits of the same significance is organized as a separate stream, and each stream is protected with a different level of ECC protection, but other arrangements can be used in alternate embodiments. For example, a stream may be made of bits from more than one column, where, for example, the most significant few bits from each weight may be formed into one stream, the least significant few bits from each weight may be formed into another stream, and perhaps also one or more streams of intermediate significance. Even for embodiments where each column of bits is formed into its own stream, streams for bits of similar levels of significance may be encoded with ECC of the same strength; for example, the first several bits of most significance could all be encoded with the same strength ECC.

FIGS. 13A and 13B illustrate the forming of the data streams into codewords and the forming of these codewords into pages, similarly to FIGS. 11B and 11C, but based on the streams rather than the weights. As illustrated in FIG. 13A, a codeword $CW'_i$ is now formed of the elements of a stream of data, in this example the stream S0 of the most significant bits of the set of weights. The codeword $CW'_i$ is formed of the S0 bit $S0_0$, $S0_1$, ..., $S0_m$ from the weights W0, W1, ..., Wm, plus the ECC or parity data P generated for the bits $S0_0$, $S0_1$, ..., $S0_m$. In some embodiments, the codeword $CW'_i$ can also include a tag field to indicate the strength of EEC used to encode the codeword, so that the corresponding EEC encoding/decoding engine or strength can be used where reading back and decoding the codeword. In other embodiments, the controller can use the characteristics of the codeword to make this determination. FIG. 13B illustrates the formation of a page $Page'_k$ based on the stream-based codewords, $CW'_1$, $CW'_2$, ..., $CW'_n$.

Figure 14:
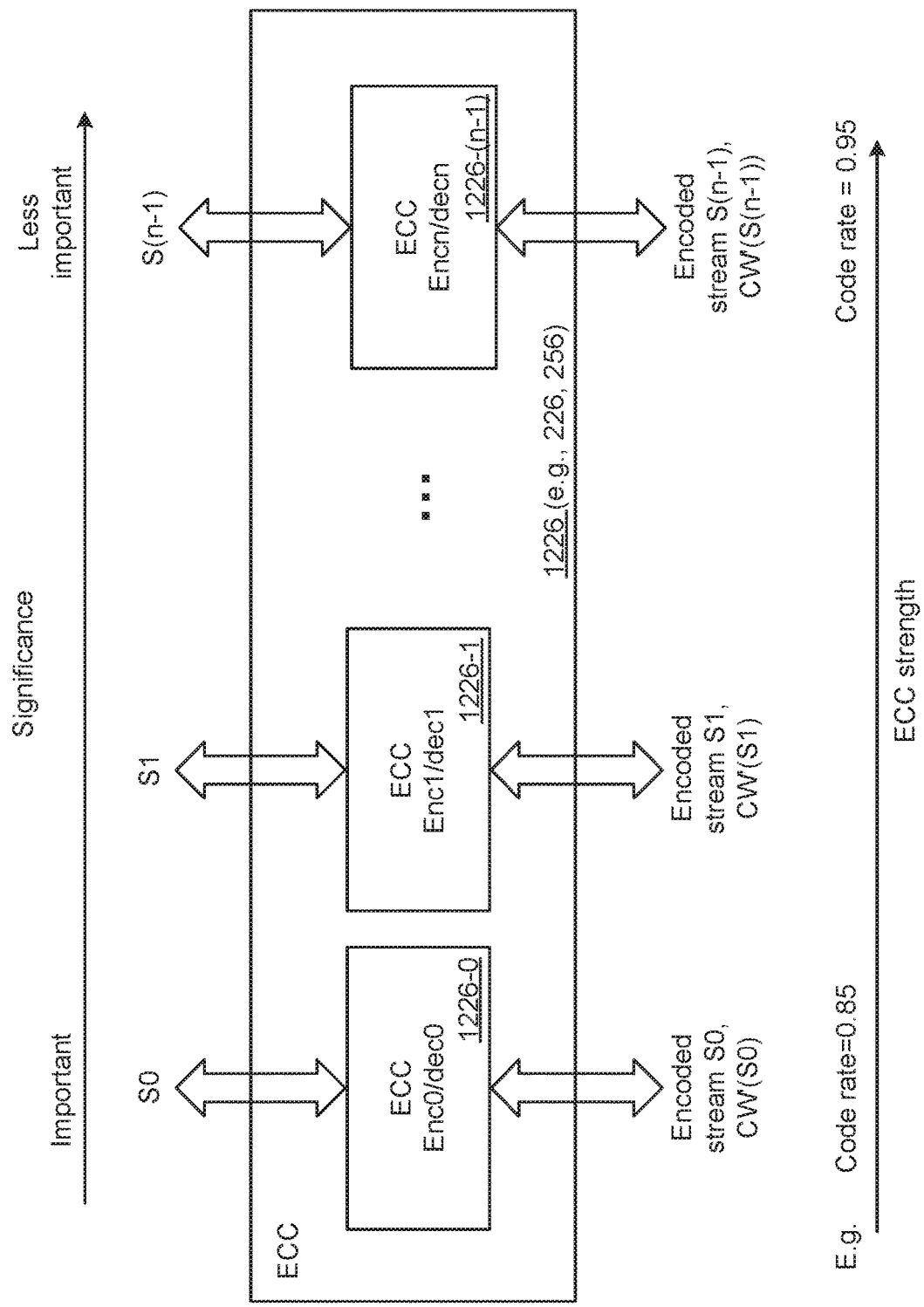
FIG. 14 is a schematic representation of the encoding process of the different data streams with different strengths of ECC.
Figure 15:
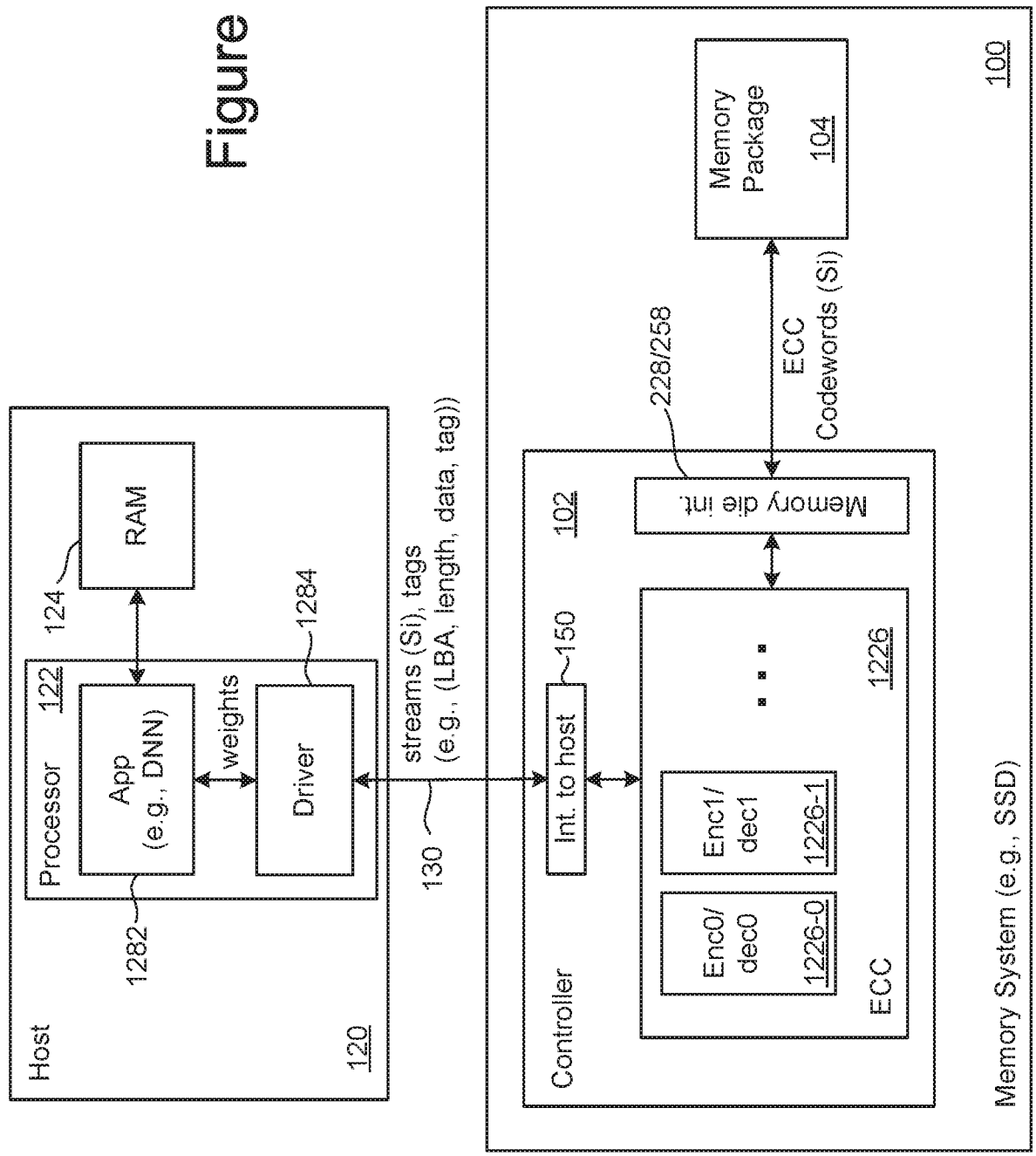
FIG. 15 is a block diagram of a memory system illustrating some of the elements of the involved in storing DNN weights with vertical ECC.
Figure 16:
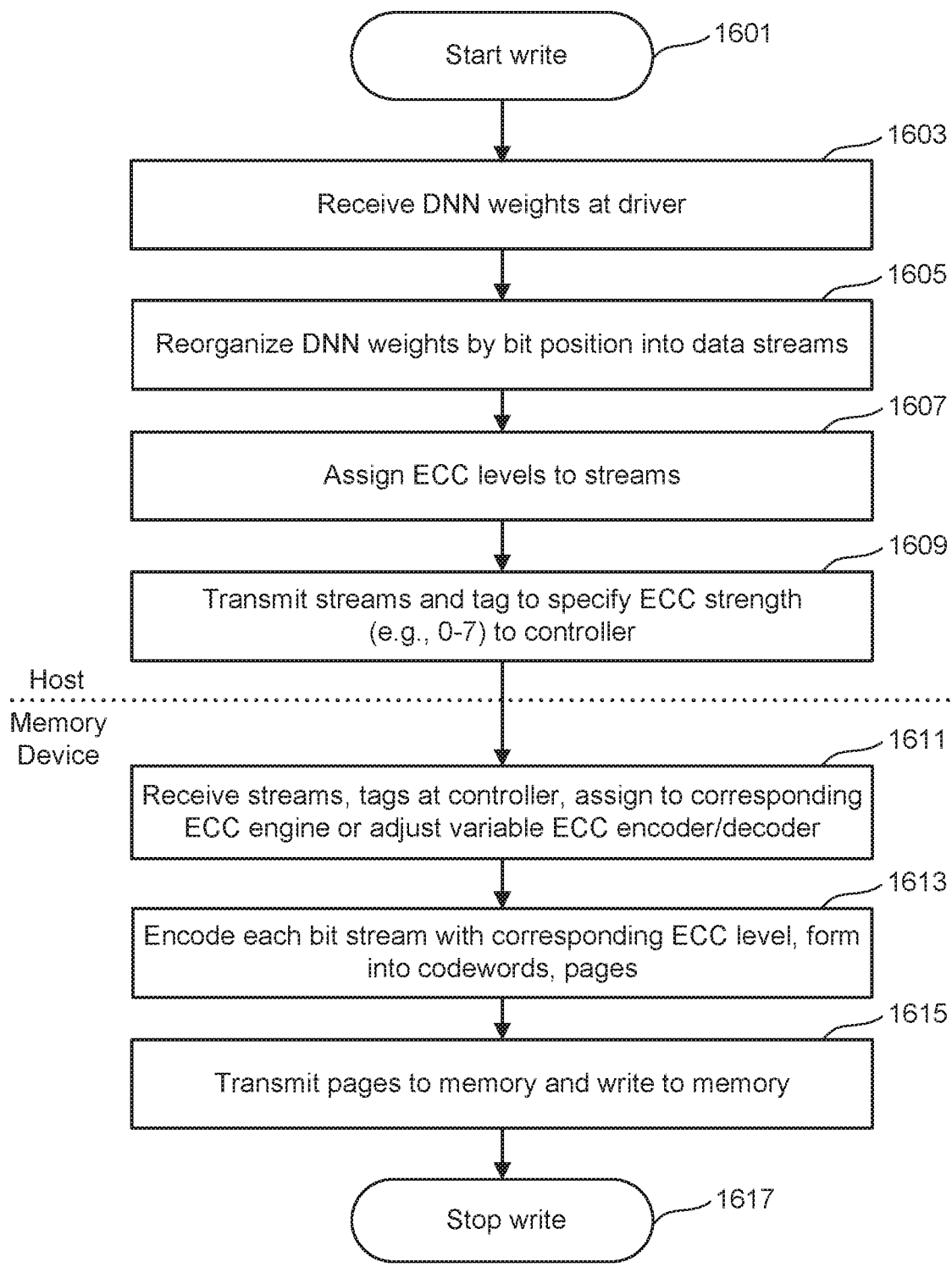
FIG. 16 is a flowchart describing one embodiment of a process for writing DNN weights with vertical ECC codes.
Figure 17:
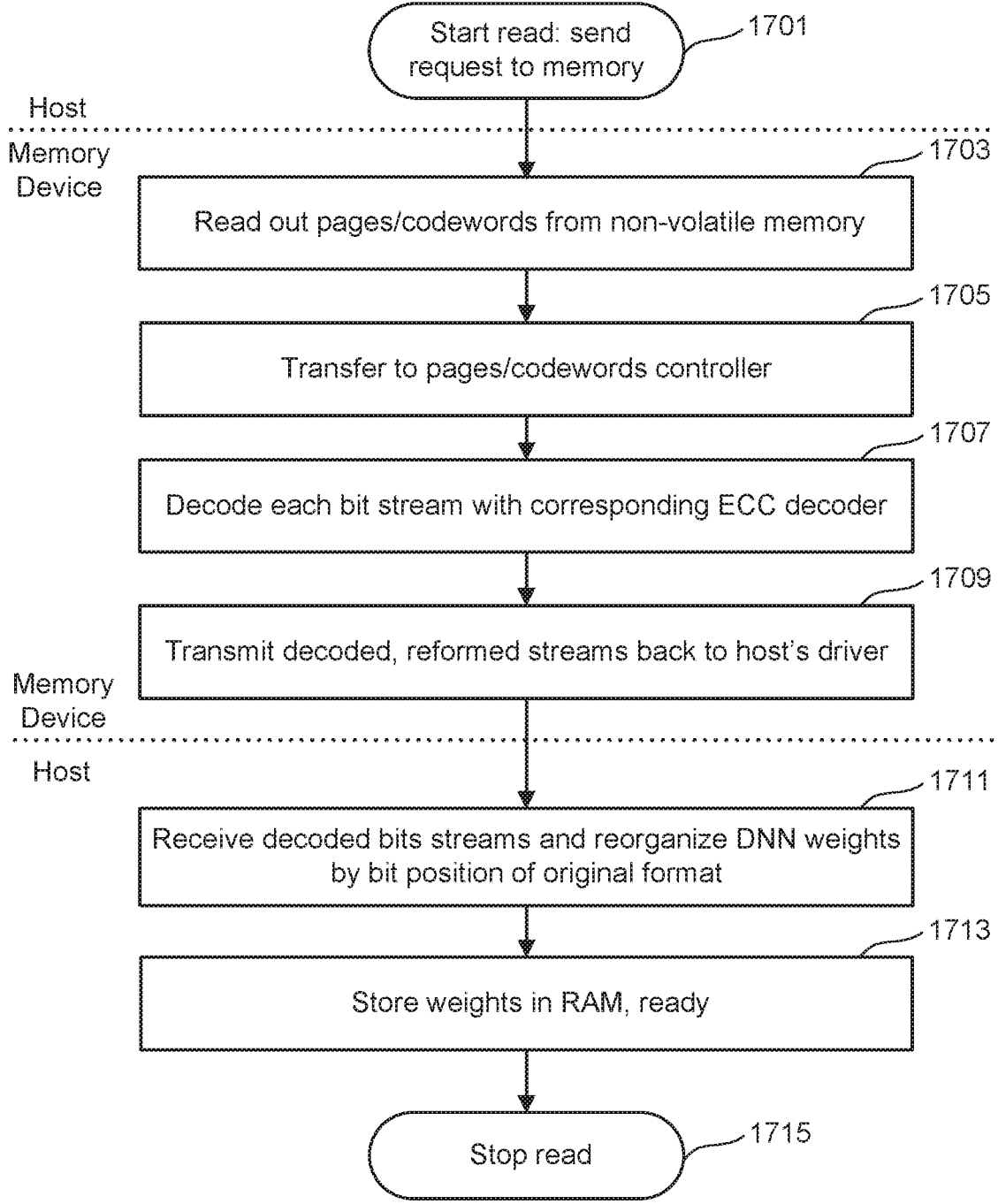
FIG. 17 is a flowchart describing one embodiment of a process for reading out DNN weights stored with vertical ECC codes.

FIG. 14 is a schematic representation of an embodiment for an ECC block 1226 encoding and decoding process of the different data streams with different strengths of ECC, where the ECC block can correspond to ECC block 226 or 256 of FIG. 3. FIG. 15 is block diagram of a memory system incorporating such an ECC block. FIGS. 16 and 17 are respectively flowcharts for an encoding process and a decoding process for a memory system using such an ECC block.

Referring to FIG. 14, after reformatting the data into steams on the host, the streams are transferred to the SSD or other non-volatile memory to be encoded with ECC and stored. In the embodiment of FIG. 14, each bit stream from the host, from the sign bit S0, to the most significant (non-sign bit) S1, and on down through the least significant bit S(n−1), is encoded by a corresponding ECC engine ECC Enc0/dec0 to ECC Encn/decn to generate a corresponding encoded stream Encoded S0 to Encoded S(n−1). Once the streams S0 to S(n−1) are encoded (typically by the memory controller) and each formed into a corresponding set of ECC codewords CW'(S0) to CW'(S(n−1)) as illustrated in FIG. 13A, the ECC codewords are then formed into pages Page' as illustrated in FIG. 13B, and written into non-volatile memory. The strength of the ECC used decreases with (or, more generally, is a non-increasing function of) the decreasing significance of the bits forming the stream. For example, the S0 stream can be encoded at a code rate=0.85 (i.e., 15% of a codeword given over to ECC, 85% to user data) and S(n−1) can be encoded at a code rate=0.95. Bit significance is generally ranked from MSB to LSB, however the signed bit may not be the most important bit in a DNN weight application, since the majority of DNN weights are zero. When reading the DNN weights back out, the process is reversed by reading out the stored pages corresponding to a stream, decoding the ECC codewords of stream by the proper decoder, and transferring the decoded stream out to the host where the streams can be reformatted back into the weights.

As illustrated in FIG. 14, one hardware ECC encoder/decoder (1226-0 for stream S0, 1226-1 for stream S1, ... 1226-[n−1] for stream [n−1])) for each stream can be used in parallel for processing. However, in other embodiments, one or more tunable ECC encoder/decoders can be used for decoding the different streams, where the ECC strength can be varied to the strength level of the stream. Generally, the more ECC encoders/decoders, the more parallelism, but at the cost of more complex circuitry. Various forms of ECC can be used, such as low-density parity-check (LDPC) codes, BCH, Reed-Solomon, or other ECC algorithms, as was discussed in more detail above.

FIG. 15 is a block diagram of a memory system illustrating some of the elements involved in storing DNN weights or other data sets using the vertical ECC arrangement described with respect to FIGS. 12-14. More specifically, FIG. 15 repeats many of the elements of FIGS. 1-3, but omitting some of the elements not discussed in the following to simplify the representation.

Host 120 communicates with controller 102 of SSD or other memory system 100 via an interface 130 that, for example, implements NVM Express (NVMe) over PCI Express (PCIe). The controller 102 can be a unified controller on a single ASIC or be formed of multiple chips such as for a FEP 110 and one or more BEPs 112, as discussed above with respect to FIGS. 1-3. On the host 120 is an application App 1282, such as a DNN or other application whose corresponding data set has the properties described above with respect to FIG. 15 for the DNN weights. DNN or other App 1282 can be executed by the host processor 122, or be a dedicated unit. RAM or other host memory 124 is connected to App 1282 and can be used to the store the application's data set when in use by App 1282. The DNN or other application 1282 can be implemented on the host through software, hardware, firmware, and various combinations of these depending on the embodiment. Considering more specifically the example where the application is a DNN, DNN 1282 will generate the series of weights W0, W1, ..., Wm, which are reformatted into the streams S0, S1, ..., S(n−1) by driver 1284.

In the write process, driver 1284 reformats the weights into the weights W0, W1, ..., Wm into the streams S0, S1, ..., S(n−1) as illustrated in FIG. 15 before these are transferred over the interface 130 to the SSD controller 102. Driver 1284 can be implemented can be executed by the host processor 122, as illustrated in FIG. 15, or be a dedicated unit, and can be implemented on the host through software, hardware, firmware, and various combinations of these depending on the embodiment. More generally, as used herein, the driver 1284 can be implemented as computer program that operates or controls the more general logic of the host process 122, specific hardware or logic for the reformatting of the weights, or some combination of these. The driver can provide an interface for software or firmware to the logic or other hardware devices the weight reformatting, enabling operating systems and other computer programs to access hardware functions without needing to know precise details about the hardware being used. When reading the weight back out of the SSD 100 for use by DNN 1282, the controller 102 will transfer the data sets back out to the driver 1284 as the streams S0, S1, . . . , S(n−1), which the driver will then reformat back into the weights W0, W1, . . . , Wm. The host 120 can then store the weights for the DNN's use in RAM 124.

In order for the controller to encode a data stream with a particular strength of ECC, when the driver 1284 transfers a data stream to the SSD 100, it will need to specify the ECC level to the controller 102 as the controller will see the stream of data as just so much data and be unaware of the significance level of the bits from which to the stream was formed. A typical format for the data transferred to the SSD 100 will specify a starting logical block address (LBA) by which the host identifies the data, the amount of data (or length of the particular stream), the actual data of the stream, and then a tag can be included to specify the ECC strength: (LBA, length, data, tag). For instance, the tag can specify an ECC strength of from 0-7 for an 8 bit representation of a set of DNN weights. The determination of the ECC strength for a bit can fixed based on bit position or variable, such as can be determined by the DNN, based on the model itself and determined during the process of determining the weights, based on user input, or some combination of these and other factors. Depending on the embodiment or the particular application, each stream can be assigned a different strength, or more than one stream can have the same strength. For example, in a DNN application where accuracy of the DNN weight values is of particular importance, such as for a self-driving automobile, multiple streams corresponding to the several most significant bits can all be specified to have the highest strength of ECC.

The SSD or other memory system includes controller 102 and one or more memory packages 104, of which only one is shown in FIG. 15. As received by interface to host 150 of the controller 102 of the SSD or other memory system 100, the data stream will include the specification of ECC strength along with the data itself. At the ECC block 1226, the stream is directed to the corresponding ECC encoding/decoding engine 1226-i, i=1−(n−1), based on the specified ECC strength level. In ECC block 1226, the streams are encoded and decoded as illustrated above with respect FIGS. 12-14, with a received steam of data encoded with the specified level of ECC, formed into codewords that are in turn formed into pages. The pages transferred from the controller 102 by the memory package or die interface 228/258 to a memory package 104 to be written into non-volatile memory. Depending on the embodiment, the memory package 104 may be one of many packages of the memory system 100, or the only memory package 104, or even a single memory die. When a requested set of DNN weights are read out, the pages of the corresponding stream are read from the memory package 104 and transferred to the ECC block 1226 and decoded, with the decoded streams transferred to the host 120, where the driver 1284 reformats the stream back to the DNN weights that the App 1282 can store in RAM 124.

FIGS. 16 and 17 are flowcharts describing an embodiment of a process for writing DNN weights with vertical ECC codes and for reading out of DNN weights stored with vertical ECC codes, respectively. The start for the write process of FIG. 16 is at step 1601, with the DNN or other App 1282 on the host 120 requesting that its data set be written to non-volatile memory. The DNN weights or other data set will have previously been generated by the DNN or other App 1282 and have the properties described above properties described above with respect to FIGS. 9, 10, 11A, 11B and 11C, namely that the elements of the data set are multi-bit values with bits of lesser significant in which the DNN or other application can accept a higher degree of error and still provide reasonable accuracy. The following will again be described largely for the DNN example, but can similarly be applied to other such data sets.

At step 1603 the DNN weights are received at the driver 1284. The driver 1284 reorganizes the values of the data set into the vertical format of data streams S0, S1, . . . , S(n−1) based on bit position, as discussed above with respect to FIG. 15, at step 1605. A corresponding ECC level is assigned to each of the streams at step 1607. The corresponding level of ECC for each of the streams can be determined by the DNN 1282 based on the training process, user input, or some combination of these. In some embodiments, each stream will have a different level of ECC applied, where this can be a fixed level based on bit position or assigned based on the particular application for which the DNN is being used. Each stream can have a different level of ECC or several streams can have the same level of ECC. The data streams with their corresponding specification of ECC strength are transmitted to the SSD 100 at step 1609.

On the SSD or other memory device 100, the data streams are received at the controller 102 at step 1611 and assigned to a corresponding ECC encoding/decoding engine of ECC block 1226. Depending on the embodiment, the ECC block can have ECC encoding/decoding engines of fixed strength, variable strength, or some combination of these. For example, for dealing with n streams of data, ECC block 1226 may include n ECC encoding/decoding engines, each of a fixed level, allowing all of the streams to be encoded in parallel; or, in another embodiment, ECC block 1226 may have only a single ECC encoding/decoding engine of variable strength that encodes the different streams sequentially, set the strength of ECC for each stream based on the streams' tags for specifying the ECC level. Other embodiments can have multiple variable ECC encoding/decoding engines or a combination of fixed and variable strength ECC encoding/decoding engines. The encoding occurs at step 1613, where the streams are formed in ECC codewords and the codewords formed into pages. The pages are then transferred to the memory packages 104 and written into non-volatile memory at step 1615, after which the DNN weight write process stops at step 1617.

FIG. 17 looks at the process of reading the DNN weights back out from the non-volatile memory device 100 for the use of the host 120, starting at step 1701 with the host 120 sending a request to the SSD or other memory device 100 for the DNN weights. On the memory device 100, the controller 102 requests the corresponding pages from the memory package 104, where these are read out at step 1703. As the pages are read out, they can be transferred to controller 102 at step 1705. The codewords of the pages are then decoded by the corresponding ECC encoding/decoding engine of ECC block 1226 at step 1707 to restore (correct, as needed) the data streams. For decoding the ECC codewords, the ECC codewords can include a specification of which ECC encoding/decoding engine or strength to use, or the controller 102 can determine the proper decoding based on the nature of the ECC portion of the ECC codeword.

The restored data streams are sent back to the host 120 at step 1709. On the host 120, the streams are received at the driver 1284 in step 1711, which then reformats the streams back into the DNN weights arranged according bit positions. The DNN 1282 can then store the restored DNN weights in RAM 124 at step 1713, where they are ready for the use of the DNN 1282, after which the read process stops at step 1715.

One embodiment an apparatus comprising a non-volatile memory controller. The non-volatile memory controller includes a host interface, one or more ECC engines, and a memory die interface. The host interface is configured to receive a data stream and a corresponding specification of a strength of error correction code (ECC) for use in encoding the stream of data. The one or more ECC engines are configured to encode the data stream into a plurality of ECC codewords encoded with one of a plurality of strengths of ECC in response to the received specification of the strength of ECC. The memory die interface is configured to transmit the ECC codewords to one or more memory die.

One embodiment includes a method that includes receiving, at a memory device, a stream of data from a host and receiving, from the host at the memory device, a tag specifying one of a plurality of levels of error correction code (ECC) strength with which to encode the stream of data from the host. The method further includes forming by the memory device from the stream of data of a plurality of ECC codewords encoded according to the specified level of ECC strength, forming the plurality of ECC codewords into a plurality of data pages, and writing the plurality of data pages into a non-volatile memory of the memory device.

A further embodiment includes a data processing apparatus. The data processing apparatus includes logic circuitry configured to execute an application providing a data set, the elements of the data set each having a plurality on n bits, each of the bits of a corresponding level of significance. The data processing apparatus also includes a driver configured to receive the data set and generate therefrom a plurality of data streams, the bits of a common level of significance from the elements of the data set belonging to the same one of the data streams. The driver is further configured to associate with each of the data streams a tag specifying one of a plurality of error correction codes levels for use in encoding the data stream into ECC codewords and to transmit the data streams and associated tags to a memory device.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a non-volatile memory controller, including:
    a host interface configured to receive a data stream and a corresponding specification of strength of error correction code (ECC) for use in encoding the data stream;
    one or more error correction code (ECC) engines configured to encode the data stream into a plurality of ECC codewords encoded with one of a plurality of strengths of ECC in response to the corresponding specification of the strength of ECC; and
    a memory die interface configured to transmit the plurality of ECC codewords to one or more memory die; and
a data processing apparatus, comprising a logic circuit configured to execute software to:
    receive a data set having a plurality of elements, the elements of the data set each having a plurality of n bits, each of the bits of a corresponding level of significance;
    receive the data set and generate therefrom the data stream from bits of a common level of significance from the elements of the data set, and
    transmit the data stream to the non-volatile memory controller, wherein the logic circuit is further configured to execute software to:
    associate with the data stream a tag specifying one of a plurality of error correction codes levels for use in encoding the data stream into ECC codewords, and
    transmit the associated tag to a memory device.

2. The apparatus of claim 1, wherein:
the memory die interface is further configured to receive a plurality of read ECC codewords from the one or more memory die;
the one or more ECC engines are further configured to decode the received plurality of read ECC codewords and form a data stream from the received plurality of read ECC codewords; and
the host interface is further configured to transmit the data stream formed from the received plurality of read ECC codewords to the host.

3. The apparatus of claim 1, wherein the one or more ECC engines includes:
a plurality of ECC engines configured to encode the data stream with a corresponding plurality of different ECC strengths, the non-volatile memory controller configured to assign the data stream to one of the ECC engines according to the data stream's specification of strength for use in encoding the data stream, wherein the plurality of ECC engines configured to concurrently encode a corresponding plurality of data streams.

4. The apparatus of claim 1, wherein the one or more ECC engines include:
an ECC engine having an adjustable level of ECC strength, the non-volatile memory control configured to adjust the level of ECC strength according to the data stream's specification of strength for use in encoding the data stream.

5. The apparatus of claim 1, further comprising:
a plurality of non-volatile memory die each configured to receive the ECC codewords and store the received ECC codewords in non-volatile memory.

6. The apparatus of claim 1, wherein the elements of the data set are weights for a deep neural network.

7. A method, comprising:
receiving, at a memory device, a stream of data from a host;
receiving from the host at the memory device a tag specifying one of a plurality of levels of error correction code (ECC) strength with which to encode the stream of data from the host;
forming by the memory device from the stream of data of a plurality of ECC codewords encoded according to the specified level of ECC strength;
forming the plurality of ECC codewords into a plurality of data pages;
writing the plurality of data pages into non-volatile memory of the memory device; and
prior to receiving the stream of data at the memory device, accessing a plurality of elements of a data set, each of the elements of the data set having a plurality of n bits, each of the bits of a corresponding level of significance; and
generating the stream of data from the elements of the data set, the stream of data is formed from bits of a common level of significance from the elements the data set;
assigning the tag specifying the level ECC strength with which to encode the stream of data; and
transmitting to the memory device from the host to the memory device the stream of data and the tag.

8. The method of claim 7, wherein forming by the plurality of ECC codewords encoded according to the specified level of ECC strength includes:
assigning the stream of data to one of a plurality of ECC encoding/decoding engines based on the tag.

9. The method of claim 7, wherein forming by the plurality of ECC codewords encoded according to the specified level of ECC strength includes:
forming the plurality of ECC codewords in an ECC encoding/decoding engine of a variable strength, the variable strength set based on the tag.

10. The method of claim 7, further comprising:
prior to receiving the stream of data at the memory device, receiving a data set of multi-bit elements and forming the stream of data from bits having a common level of significance from a plurality of the multi-bit elements.

11. The method of claim 7, further comparing:
subsequent to writing the plurality of data pages into non-volatile memory, reading back the plurality of data pages from the non-volatile memory;
decoding the ECC codewords of the data pages read back from the non-volatile memory; and
reforming the decoded ECC codewords into a stream of data.

12. The method of claim 7, wherein forming from the stream of data of a plurality of ECC codewords encoded according to the specified level of ECC strength includes:
assigning the steam of data to one of a plurality of ECC engines based on the specified level of ECC strength; and
forming the ECC codewords from the stream of data by the assigned ECC engine.

13. A data processing apparatus, comprising:
a logic circuit configured to execute an application providing a data set having a plurality of elements, the elements of the data set each having a plurality of n bits, each of the bits of a corresponding level of significance; and
a driver configured to:
receive the data set and generate therefrom a plurality of data streams, the bits of a common level of significance from the elements of the data set belonging to the same one of the data streams,
associate with each of the data streams a tag specifying one of a plurality of error correction codes levels for use in encoding the data stream into ECC codewords, and
transmit the data streams and associated tags; and
a memory device, comprising:
one or more non-volatile memory die; and
a non-volatile memory controller configured to receive the data streams and associated tags, encode the data streams into ECC code words according to the associated tags, and transmit the ECC codewords to the one or more memory die, the non-volatile memory controller comprising one or more ECC engines configured to encode the data streams into the ECC codewords encoded with one of a plurality of strengths of ECC based on the associated tags.

14. The data processing apparatus of claim 13, wherein, subsequent to transmitting the data streams to the memory device, the driver is further configured to receive the data streams from the memory device and reform the data set from the data streams.

15. The data processing apparatus of claim 13, wherein the number of data streams is n, each of the data streams corresponding to bits of elements having the same level of significance.

16. The data processing apparatus of claim 13, wherein the application is configured to generate the tags.

17. The data processing apparatus of claim 13, wherein the tags are provided by a user.

18. The data processing apparatus of claim 13, wherein the application is a deep neural network and the data set are weights for the deep neural network.

19. The data processing apparatus of claim 13, wherein the one or more ECC engines includes:
a plurality of ECC engines configured to encode the data streams with a corresponding plurality of different ECC strengths, the non-volatile memory controller configured to assign the data stream to one of the ECC engines according to the data stream's associated tag, wherein the plurality of ECC engines configured to concurrently encode a corresponding plurality of data streams.

* * * * *